United States Patent
Lai et al.

(10) Patent No.: US 7,447,029 B2
(45) Date of Patent: Nov. 4, 2008

(54) VAPOR CHAMBER FOR DISSIPATION HEAT GENERATED BY ELECTRONIC COMPONENT

(75) Inventors: Cheng-Tien Lai, Guangdong (CN); Zhi-Yong Zhou, Guangdong (CN); Qiao-Li Ding, Guangdong (CN)

(73) Assignees: Fu Zhun Precision Industry (Shen Zhen) Co., Ltd., Longhua Town, Bao'an District, Shenzhen, Guangdong (CN); Foxconn Technology Co., Ltd., Tu-Chen, Taipei Hsien (TW)

( * ) Notice: Subject to any disclaimer, the term of this patent is extended or adjusted under 35 U.S.C. 154(b) by 197 days.

(21) Appl. No.: 11/308,231

(22) Filed: Mar. 14, 2006

(65) Prior Publication Data

US 2007/0217154 A1    Sep. 20, 2007

(51) Int. Cl.
*H05K 7/20* (2006.01)
(52) U.S. Cl. ............. 361/700; 165/104.26; 165/104.33; 165/185; 165/104.21
(58) Field of Classification Search ................. 361/699, 361/700; 165/104.26, 104.33, 104.21, 185; 174/15.2; 257/E23.088, E23.099, 712–715
See application file for complete search history.

(56) References Cited

U.S. PATENT DOCUMENTS

| | | | | |
|---|---|---|---|---|
| 5,427,174 A * | 6/1995 | Lomolino et al. ...... | 165/104.13 |
| 5,937,936 A * | 8/1999 | Furukawa et al. ...... | 165/104.33 |
| 6,269,866 B1 * | 8/2001 | Yamamoto et al. ..... | 165/104.26 |
| 6,317,322 B1 | 11/2001 | Ueki et al. | |
| 6,679,318 B2 * | 1/2004 | Bakke .................... | 165/104.26 |
| 6,749,013 B2 * | 6/2004 | Ikeda et al. ............ | 165/104.26 |
| 6,889,756 B1 * | 5/2005 | Hou ....................... | 165/104.33 |
| 6,901,994 B1 * | 6/2005 | Jin-Cherng et al. .... | 165/104.26 |
| 6,957,692 B1 * | 10/2005 | Win-Haw et al. ...... | 165/104.33 |
| 7,032,652 B2 * | 4/2006 | Wang et al. ............ | 165/104.26 |
| 7,061,104 B2 * | 6/2006 | Kenny et al. ................ | 257/714 |
| 7,069,975 B1 * | 7/2006 | Haws et al. ................... | 165/10 |
| 2006/0011336 A1 * | 1/2006 | Frul .......................... | 165/185 |
| 2006/0096740 A1 * | 5/2006 | Zheng .................... | 165/104.26 |
| 2007/0119575 A1 * | 5/2007 | Glezer et al. ........... | 165/104.33 |

FOREIGN PATENT DOCUMENTS

CN    1179188 C    12/2004

* cited by examiner

*Primary Examiner*—Jayprakash N Gandhi
*Assistant Examiner*—Courtney L Smith
(74) *Attorney, Agent, or Firm*—Winston Hsu

(57) ABSTRACT

A vapor chamber includes a base (100) for contacting a heat-generating component (500), a cover (200), a first porous capillary sheet (300) located in the base and a second porous capillary sheet (400) located in the cover and facing the first porous capillary sheet. The base comprises a block (130) extending from the base to thermally connect with the cover. The cover is mounted on the base and forms a hermetically sealed container together with the base. The first and second porous capillary sheets together form an enclosure and are contained in the container, and the block extends through the first and second porous capillary sheets and engage therewith.

2 Claims, 10 Drawing Sheets

US 7,447,029 B2

VAPOR CHAMBER FOR DISSIPATION HEAT GENERATED BY ELECTRONIC COMPONENT

FIELD OF THE INVENTION

The present invention relates to a vapor chamber, and more particularly to a plate type vapor chamber for cooling an electronic part such as a semiconductor or the like mounted on a circuit board, wherein heat can be rapidly transmitted from a portion of a base of the vapor chamber in contact with the electronic part to other portions of the vapor chamber.

DESCRIPTION OF RELATED ART

As computer technology continues to advance, electronic components such as central processing units (CPUs) of computers are made to provide faster operational speeds and greater functional capabilities. When a CPU operates at a high speed in a computer enclosure, its temperature usually increases enormously. It is desirable to dissipate the generated heat of the CPU quickly.

Conventionally, a plate type vapor chamber is used to dissipate heat generated by a CPU. Referring to FIG. 10, a conventional plate type vapor chamber comprises a hermetically sealed container 10 having a quantity of water enclosed therein. The container 10 comprises a base 12 for contacting a heat-generating component such as a CPU, and a cover 14 facing the base 12. A plurality of fins 20 is attached to the cover 14 of the flat type vapor chamber. In use, heat produced by the CPU is conducted to the base 12 and evaporates the water into a vapor. The vapor flows towards the cover 14 and dissipates the heat thereto, then condenses into water and returns back to the base 12 for another circulation. The heat transferred to the cover 14 is radiated by the fins 20 to surrounding air.

The conventional plate type vapor chamber dissipates the heat produced by the CPU as latent heat. This avails the vapor chamber to dissipate a large quantity of heat with a small size. In use, only a central portion of the base 12 contacts the CPU; the central portion has a higher temperature than that of the other portions. If the water can not be timely supplied to the central portion of the base 12, an overheat (or called dry-out) of the vapor chamber may occur. When the dry-out happens, the heat of the base 12 can be transferred to the cover 14 only through side walls of the container 10 of the vapor chamber. The heat transfer capability of the side walls of the container 10 by conduction is relatively low, in comparison with the phase change of the water in the vapor chamber. The dry-out problem degrades the heat transferring efficiency, and limits the use of the conventional plate type vapor chamber, even damages the conventional plate type vapor chamber.

What is needed, therefore, is a vapor chamber, which has a better heat dissipation efficiency.

SUMMARY OF INVENTION

A vapor chamber comprises a base for contacting a heat-generating component, a cover, a first porous capillary sheet located in the base and a second porous capillary sheet located in the cover and facing the first porous capillary sheet. The base comprises a block extending therefrom towards a direction away from the heat-generating component. The cover is mounted on the base and forms a hermetically sealed container together with the base. The block thermally contacts with both the base and cover. Furthermore, the block is located just above a portion of the base for contacting with the heat-generating component. The first and second porous capillary sheets together form an enclosure contained in the container, and the block extends through the first and second porous capillary sheets and contacts therewith.

Other advantages and novel features will become more apparent from the following detailed description of preferred embodiments when taken in conjunction with the accompanying drawings, in which:

DETAILED DESCRIPTION

Figure 1:
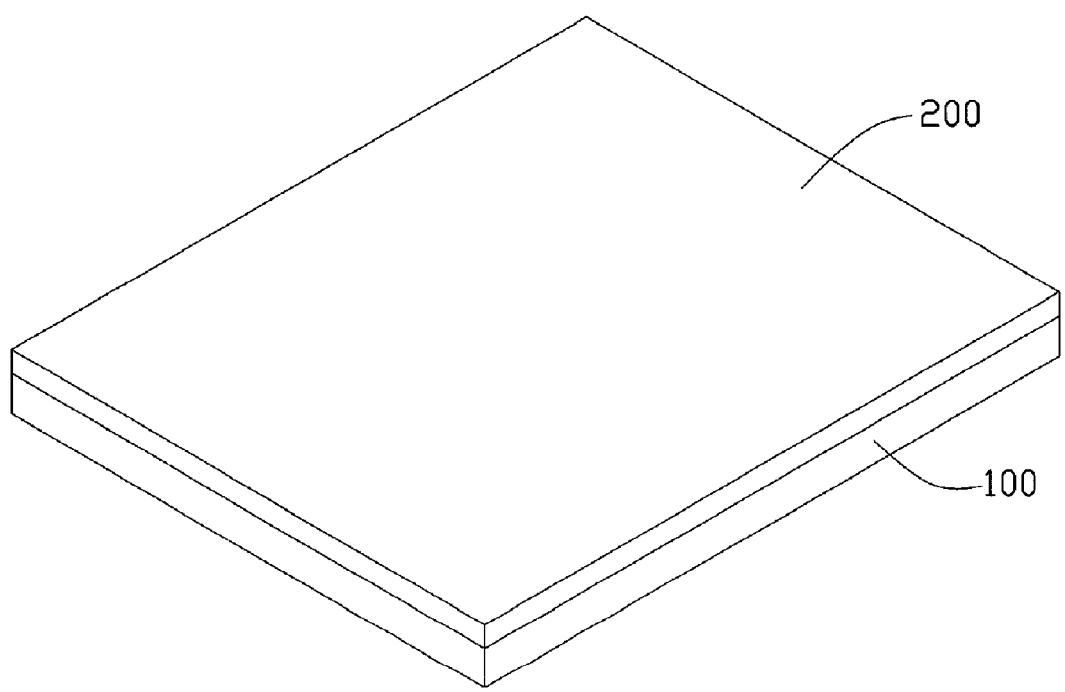
FIG. 1 is a perspective view of a vapor chamber in accordance with a first preferred embodiment of the present invention.
Figure 2:
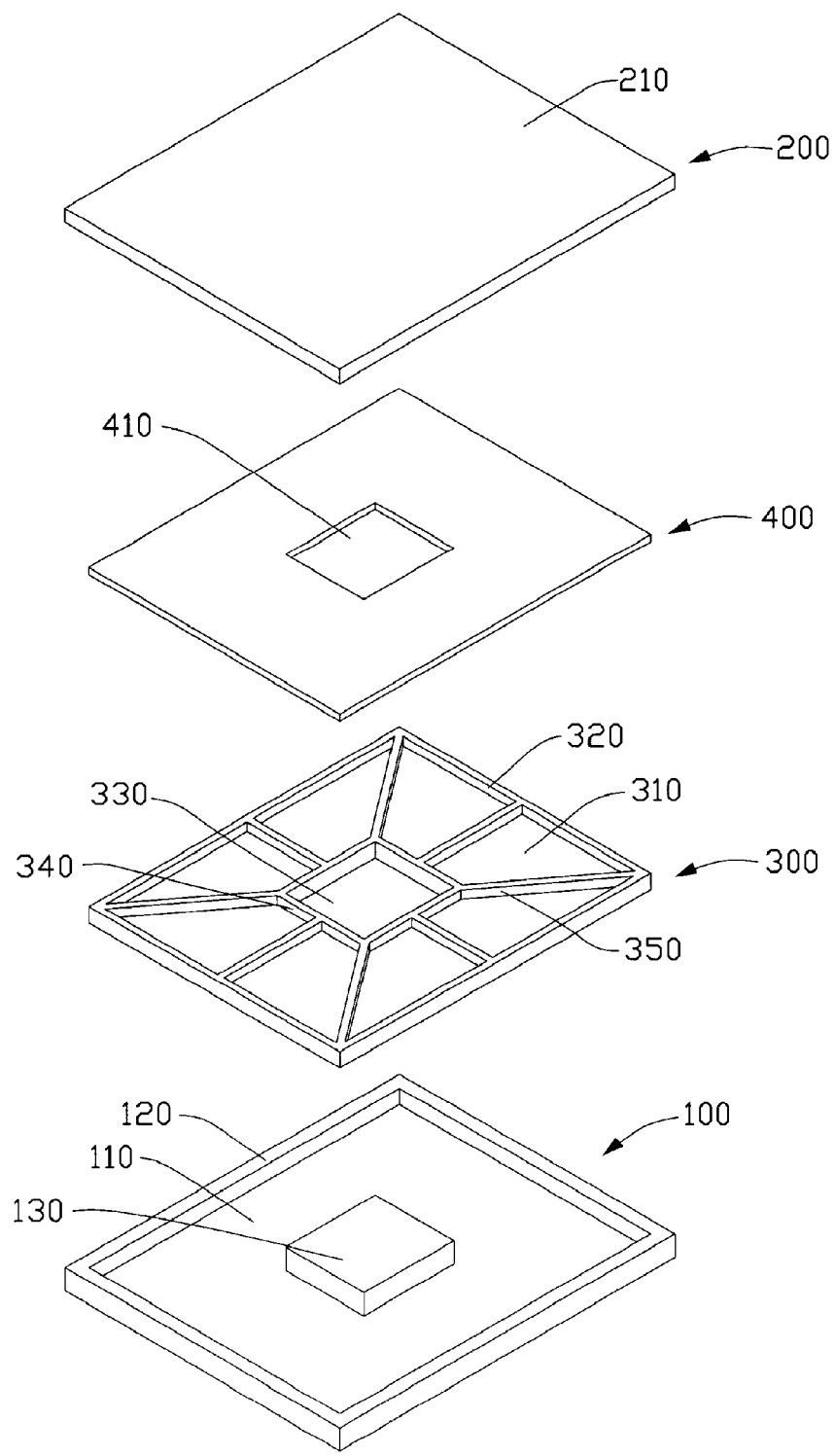
FIG. 2 is an exploded view of FIG. 1, showing an inner structure of the vapor chamber of FIG. 1.

Referring to FIGS. 1-4, a vapor chamber in accordance with a first preferred embodiment of the invention comprises a base 100, a cover 200 sealed to the base 100 around their peripheral flanges 120, 220, and a first and a second porous capillary sheets 300, 400 tightly attached to the facing surfaces of the base 100 and the cover 200, respectively. An appropriate quantity of liquid such as water (not shown) is also placed within the vapor chamber to act as a heat transfer liquid. The quantity of the liquid to be used can be easily determined by those skilled in the art of vapor chamber. The first and second porous capillary sheets 300, 400 have a plurality of pores, which have a capillary function, and move the water by surface tension. The water is guided by the first and second porous capillary sheets 300, 400 to be uniformly and quickly spread at the base 100. The first and second porous capillary sheets 300, 400, according to the preferred embodiment, are made of metal powders such as copper powders via sintering. It can be understood that the sheets 300, 400 can be made by other methods, such as weaving of metal wires. For the sintering, the metal powders can be directly sintered on the facing surfaces of the base 100 and the cover 200 to form the first and second porous capillary sheets 300, 400, respectively.

The base 100 has a rectangular bottom 110 for contacting a CPU 500 mounted on a printed circuit board 600 (shown in FIG. 5), and the four flanges 120 extend perpendicularly upwardly from four sides of the bottom 110, respectively. According to the invention, it is a central portion of a bottom face (not labeled) of the bottom 110 of the base 100 that is brought to contact with the CPU 500. A block 130 extends upwardly from a central portion of a top face (not labeled) of the bottom 110 of the base 100. Accordingly, the CPU 500 is engaged with the base 100 under the block 130. The block 130 is made of heat conductive material such as cooper or aluminum, and used for conducting heat from the base 100 to the cover 200. The base 100 and the cover 200 are also made of heat conductive material such as copper or aluminum. An annular space (not labeled) is formed in the base 100 around the block 130 for receiving the first porous capillary sheet 300.

Figure 3:
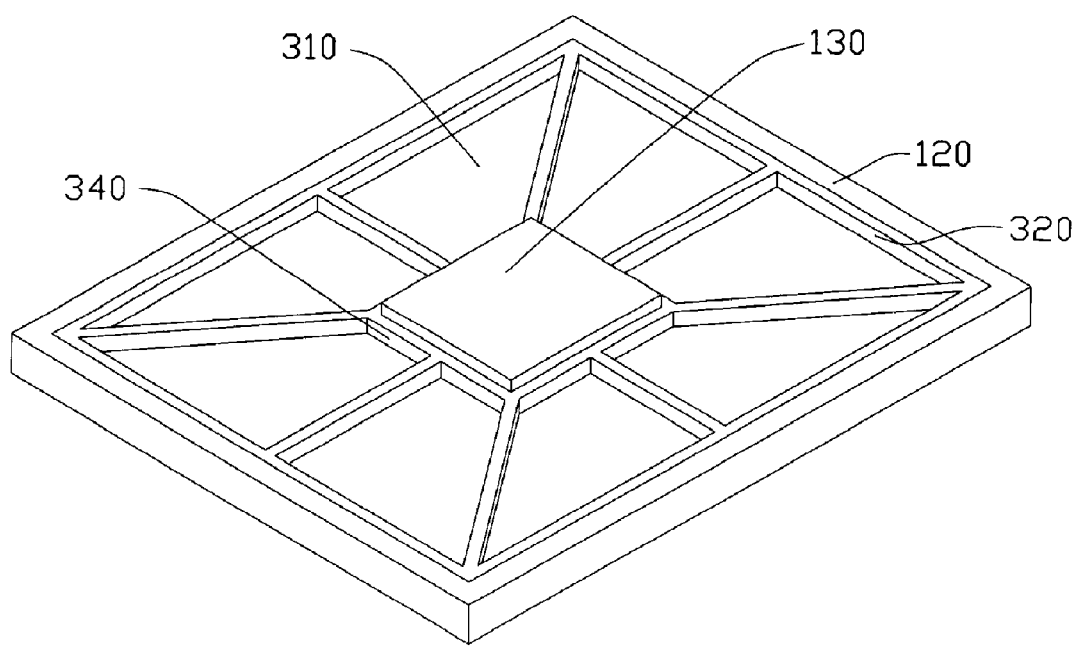
FIG. 3 is a partially assembled view of a base and a porous capillary sheet of FIG. 2.

The first porous capillary sheet 300 comprises a bottom wall 310 with a rectangular configuration, and four outer walls 320 extending upwardly from four sides of the bottom wall 310, respectively. A rectangular hole 330 is defined through a center portion of the bottom wall 310 for the block 130 of the base 100 to extend therethrough. Four inner walls 340 extend upwardly from four edges of the rectangular hole 330. A plurality of ribs 350 extends radially and outwardly from an outer periphery of the inner walls 340 towards the outer walls 320. The ribs 350 divide the annulus space of the base 100 into several parts. FIG. 3 shows that the first porous capillary sheet 300 is on the base 100, in which the bottom wall 310 and the outer walls 320 of the first porous capillary sheet 300 engage with the bottom 110 and the flanges 120 of the base 100, respectively. The inner walls 340 of the first porous capillary sheet 300 tightly surround an outer periphery of the block 130 simultaneously.

Figure 4:
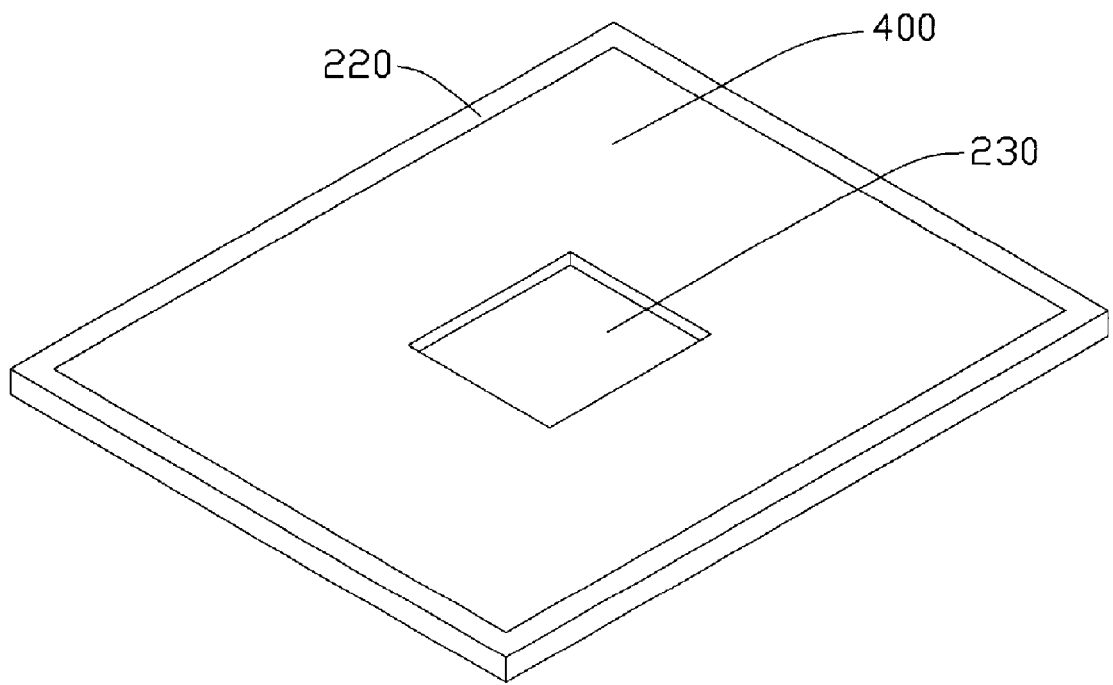
FIG. 4 is a partially assembled view of a cover and another porous capillary sheet of FIG. 2.

Referring also to FIG. 4, the cover 200 is used for covering the base 100 to form a hermetically sealed container. The cover 200 has a rectangular board 210, and four flanges 220 extending perpendicularly downwards from four sides of the board 210. Therefore, a recessed space is formed in the cover 200 for receiving the second porous capillary sheet 400. The second porous capillary sheet 400 is a plate having an opening 410 defined therein. The opening 410 is aligned with the hole 330 of the first porous capillary sheet 300 for receiving the block 130 of the base 100. When the second porous capillary sheet 400 is on the cover 200, a depression 230 is formed in a center portion of the cover 200 for accommodating a top end of the block 130.

Figure 5:
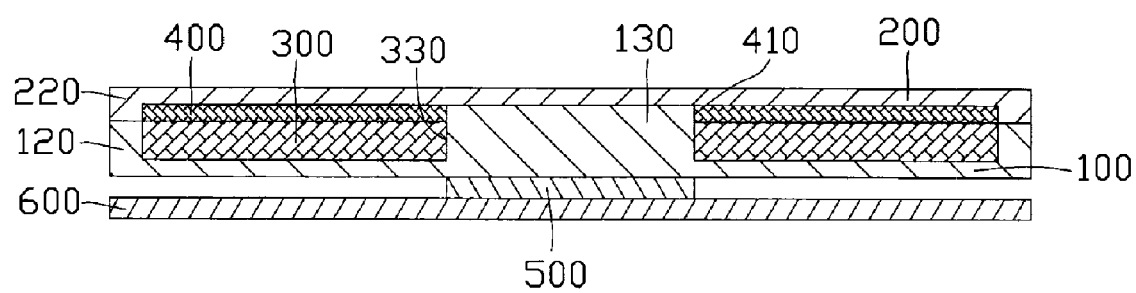
FIG. 5 is a cross-sectional view of the vapor chamber of FIG. 1, together with a CPU mounted on a printed circuit board.
Figure 6:
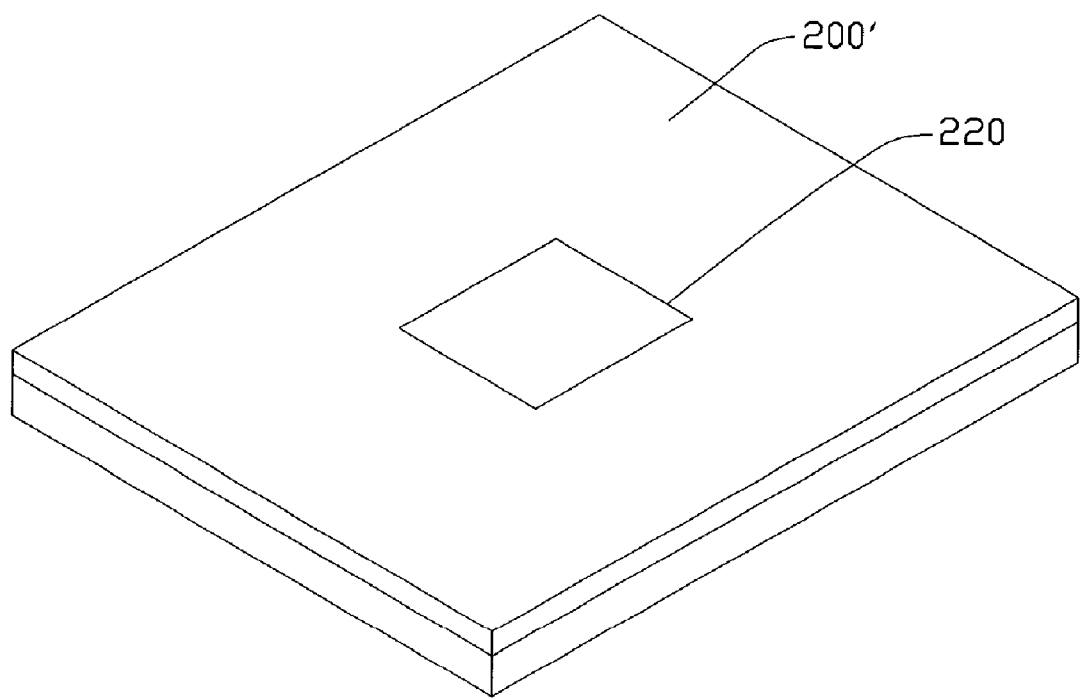
FIG. 6 is a perspective view of a vapor chamber in accordance with a second preferred embodiment of the present invention.
Figure 7:
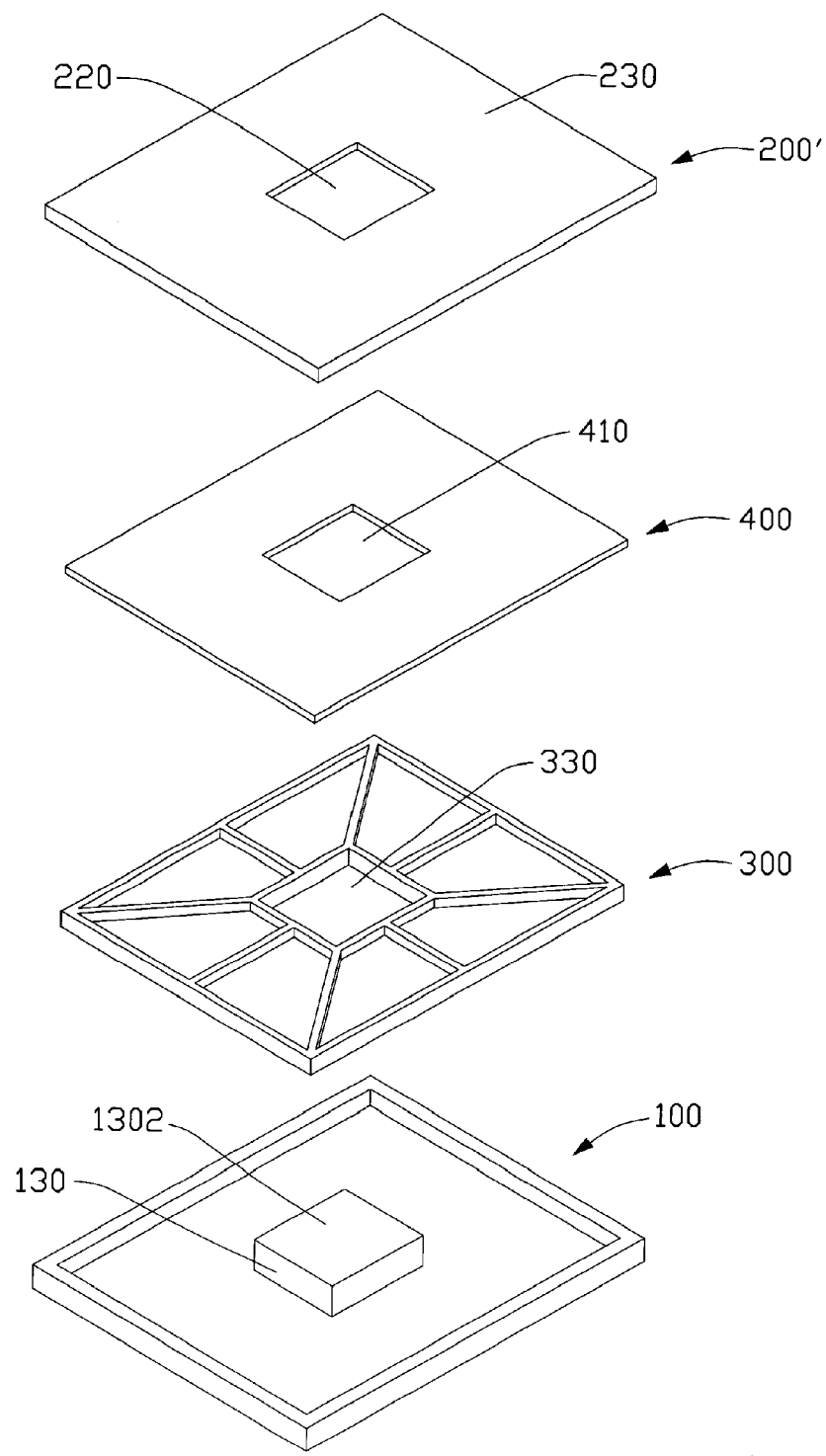
FIG. 7 is an exploded view of FIG. 6, showing an inner structure of the vapor chamber of FIG. 6.
Figure 8:
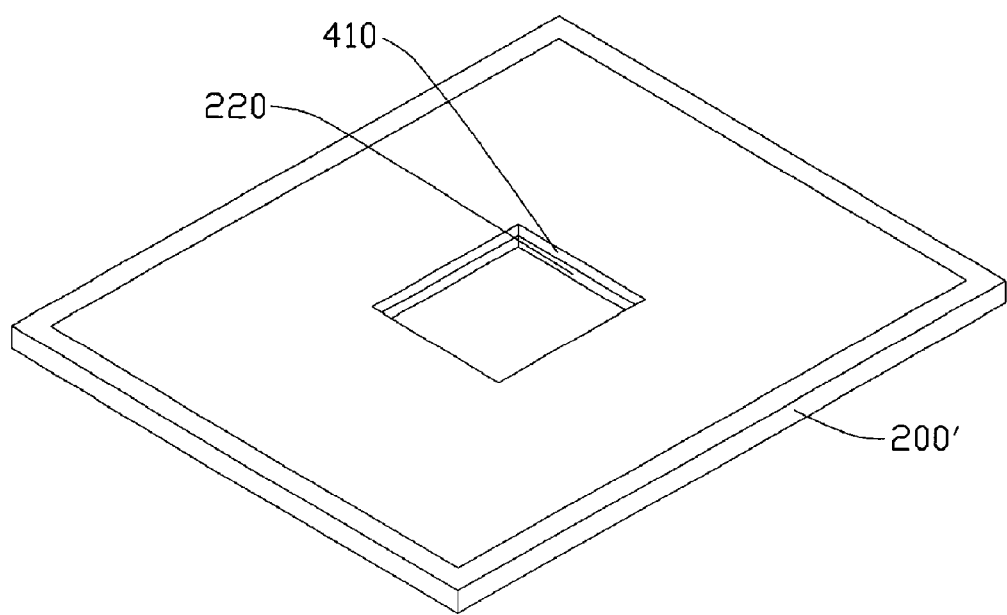
FIG. 8 is a partially assembled view of a cover and a porous capillary sheet of FIG. 7.
Figure 9:
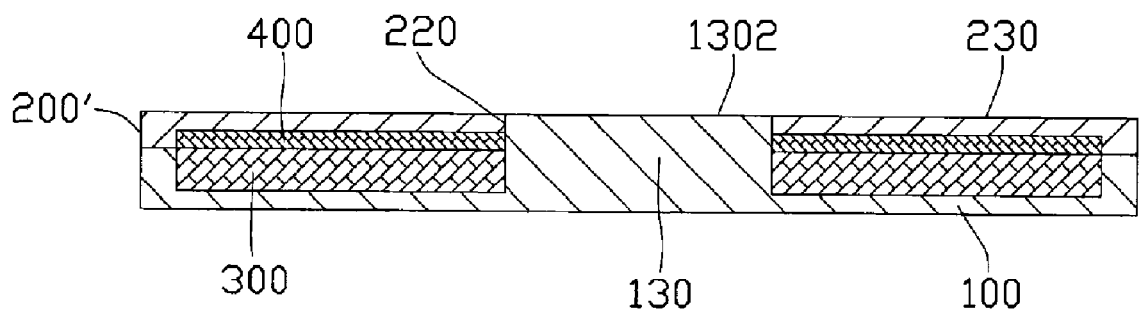
FIG. 9 is a cross-sectional view of the vapor chamber of FIG. 6.
Figure 10:
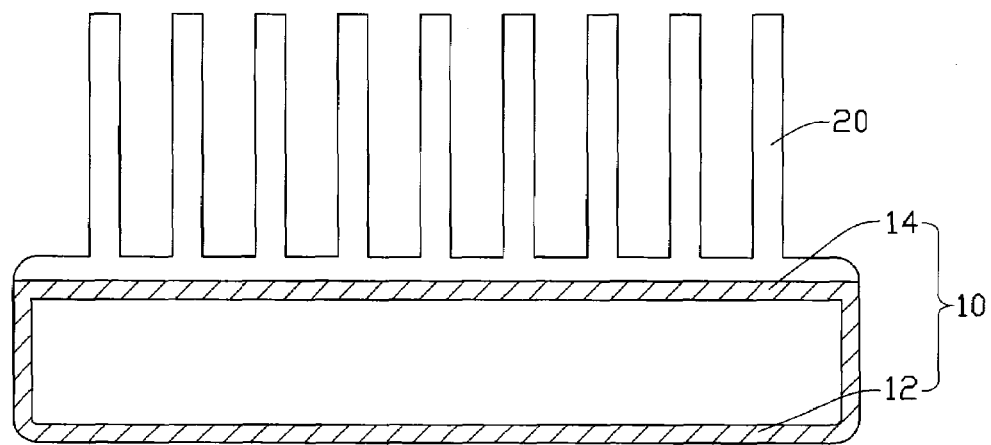
FIG. 10 is a cross-sectional view of a conventional vapor chamber with a plurality of fins thereon.

FIG. 5 shows a cross-sectional view of the vapor chamber in accordance with the first preferred embodiment of the present invention. The cover 200 together with the second porous capillary sheet 400 is sealed to the base 100 around their peripheral flanges 120, 220 to form a hermetically sealed container. Therefore, the first and second porous capillary sheets 300, 400 are enclosed in the container, and the first and second porous capillary sheets 300, 400 form an enclosure contained in the container, simultaneously. The ribs 350 divide the enclosure into several small enclosed spaces for accommodating vapor of the water. The enclosure is tightly against the container. Thus, when the vapor condenses into water, the water can be quickly and uniformly guided back to the base 100 and the block 130 for another circulation. The enclosure together with the ribs 350 can accelerate the water returning back to wet the base 100 and the block 130 to improve the heat dissipation efficiency of the vapor chamber.

The block 130 of the base 100 extends through the rectangular hole 330 of the first porous capillary sheet 300 and the opening 410 of the second porous capillary sheet 400, and contacts the cover 200. Therefore, the block 130 can directly conduct heat from the base 100 to the cover 200. The inner walls 340 and the second porous capillary sheet 400 tightly contact with the outer surface of the block 130 to keep the outer surface of the block 130 wet. Thus, the block 130 can be always supplied with liquid to prevent the dry-out problem confronted in the prior art vapor chamber.

FIGS. 6-9 show another vapor chamber in accordance with a second preferred embodiment of the present invention. The main difference between the second and first embodiments is that a rectangular opening 220 is defined through the cover 200'. The opening 220 of the cover 200' is aligned with the opening 330 of the first porous capillary sheet 300 and the rectangular hole 410 of the second porous capillary sheet 400 for receiving the block 130 of the base 100. The block 130 of the base 100 extends through the rectangular hole 330 of the first porous capillary sheet 300, the opening 410 of the second porous capillary sheet 400 and the rectangular opening 220 of the cover 200' in turn. An upper surface 1302 of the block 130 of the base 100 and an upper surface 230 of the cover 200' are positioned in a same plane.

In operation of the vapor chamber of the preferred embodiments of the invention, the heat generated by the CPU 500 is absorbed by the base 100. A part of the heat absorbed by the base 100 is directly transferred to the cover 200 (200') via the block 130 of the base 100 by means of heat conduction of metal. According to the invention, the block 130 thermally engages with the cover 200 (200'). The other part of the heat absorbed by the base 100 evaporates the water in the vapor chamber into a vapor. The vapor flows towards the cover 200 (200'), dissipates the heat thereto, and then is condensed into water and returns back to the base 100 for another circulation. Therefore, the other part of the heat absorbed by the base 100 is transferred to the cover 200 (200') by means of phase change of fluid. At last, the cover 200 (200') dissipates the heat to surrounding air.

The block 130 of the base 100 can quickly conduct the heat from the base 100 to the cover 200 (200'), whereby the heat absorbed by the base 100 from the CPU can be more evenly and quickly distributed to whole vapor chamber. Therefore, the dry-out problem of the vapor chamber can be mitigated, and the reliability and heat dissipation efficiency of the vapor chamber are improved.

It can be understood that a plurality of fins (not shown) may be attached to the cover 200 (200') to further improve the heat dissipation of the vapor chamber.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A vapor chamber comprising:
    a container having a base for contacting a heat-generating component, the container comprising a block located therein, the block thermally connecting the base and a cover of the container;
    a porous capillary enclosure contained within the container, the enclosure comprising a through hole defined therethough for accommodating the block; and
    a liquid contained in the container, wherein the porous capillary enclosure keeps an inner surface of the container and an outer surface of the block wet; and
    wherein an opening is defined through the cover and the block is received in the through hole of the enclosure and the opening of the cover, and wherein an upper surface of the block and an upper surface of the container are positioned in a same plane.

2. The vapor chamber as claimed in claim 1, wherein a plurality of ribs is located in the enclosure and divides the enclosure into several enclosed spaces.

* * * * *